United States Patent
Lee

(10) Patent No.: US 8,633,761 B2
(45) Date of Patent: Jan. 21, 2014

(54) POWER AMPLIFIER INSENSITIVE TO LOAD IMPEDANCE CHANGES

(75) Inventor: Jong Soo Lee, Gwangju (KR)

(73) Assignee: Gwangju Institute of Science and Technology, Buk-Gu, Gwangju (KR)

( * ) Notice: Subject to any disclaimer, the term of this patent is extended or adjusted under 35 U.S.C. 154(b) by 0 days.

(21) Appl. No.: 13/575,095

(22) PCT Filed: Feb. 5, 2010

(86) PCT No.: PCT/KR2010/000733
§ 371 (c)(1),
(2), (4) Date: Jul. 25, 2012

(87) PCT Pub. No.: WO2011/093547
PCT Pub. Date: Aug. 4, 2011

(65) Prior Publication Data
US 2012/0293249 A1    Nov. 22, 2012

(30) Foreign Application Priority Data
Jan. 26, 2010  (KR) .......................... 10-2010-0006984

(51) Int. Cl.
*G06G 7/12*  (2006.01)

(52) U.S. Cl.
USPC ........................... 327/560; 327/108; 343/852

(58) Field of Classification Search
USPC .................... 327/560, 50, 51, 108, 109, 519;
343/852, 745, 782, 814, 816, 822, 860;
333/17.2, 32, 124, 130
See application file for complete search history.

(56) References Cited

U.S. PATENT DOCUMENTS

| | | | |
|---|---|---|---|
| 5,422,595 A * | 6/1995 | Lott ................................. 330/2 |
| 6,297,696 B1 * | 10/2001 | Abdollahian et al. .... 330/124 R |
| 6,414,562 B1 * | 7/2002 | Bouisse et al. .................. 333/32 |
| 2002/0145483 A1 * | 10/2002 | Bouisse ...................... 333/17.3 |
| 2008/0074735 A1 * | 3/2008 | Bakalski et al. ........... 359/337.4 |
| 2009/0261900 A1 * | 10/2009 | Ilkov ......................... 330/124 R |
| 2011/0043282 A1 * | 2/2011 | Drogi et al. .................... 330/131 |

* cited by examiner

*Primary Examiner* — Lincoln Donovan
*Assistant Examiner* — Jung H Kim
(74) *Attorney, Agent, or Firm* — Nath, Goldberg & Meyer; Jerald L. Meyer; Scott C. Langford

(57) ABSTRACT

Disclosed herein is a power amplifier insensitive to load impedance changes. According to the present invention, the power amplifier comprises a power amplification circuit which amplifies an input signal, an output matching circuit connected to an output terminal of the power amplification circuit to perform impedance matching between the power amplification circuit and an antenna load, and a 4-port coupler connected between the output matching circuit and the antenna load.

12 Claims, 16 Drawing Sheets

Fig. 2
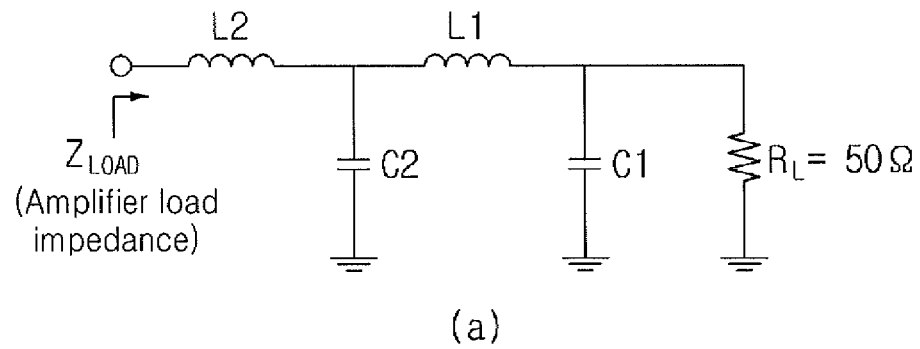
(a)
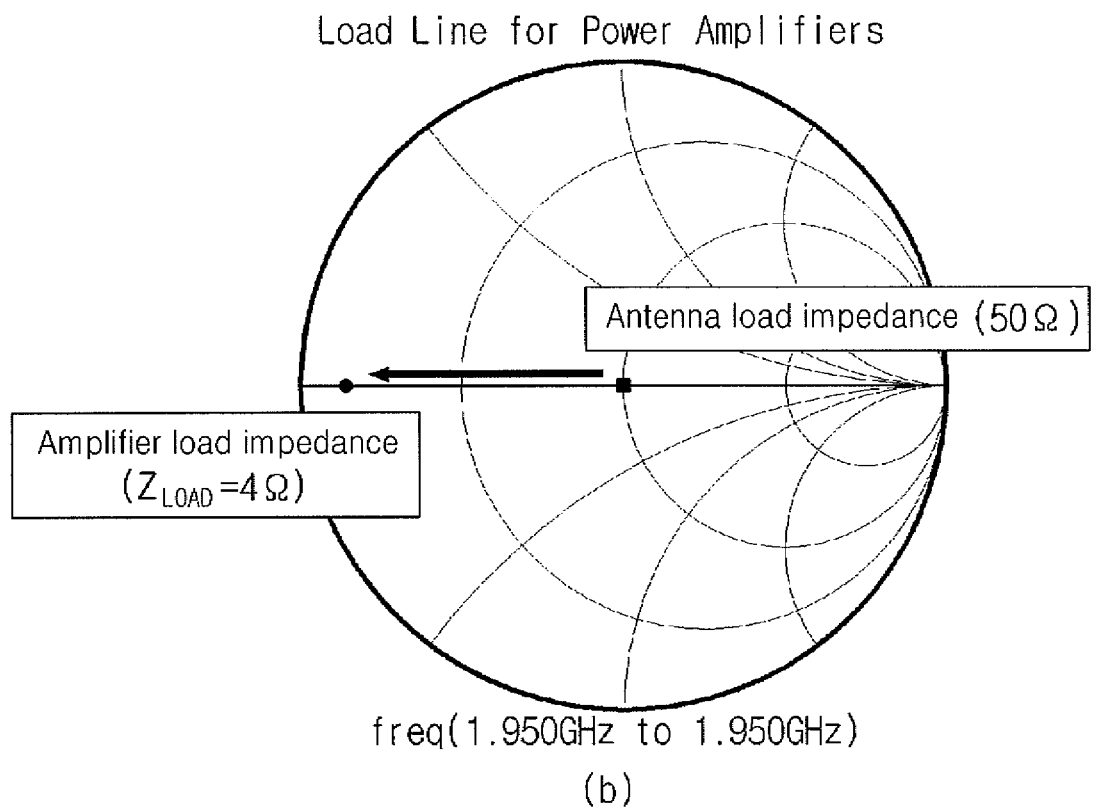
(b)

Fig. 3
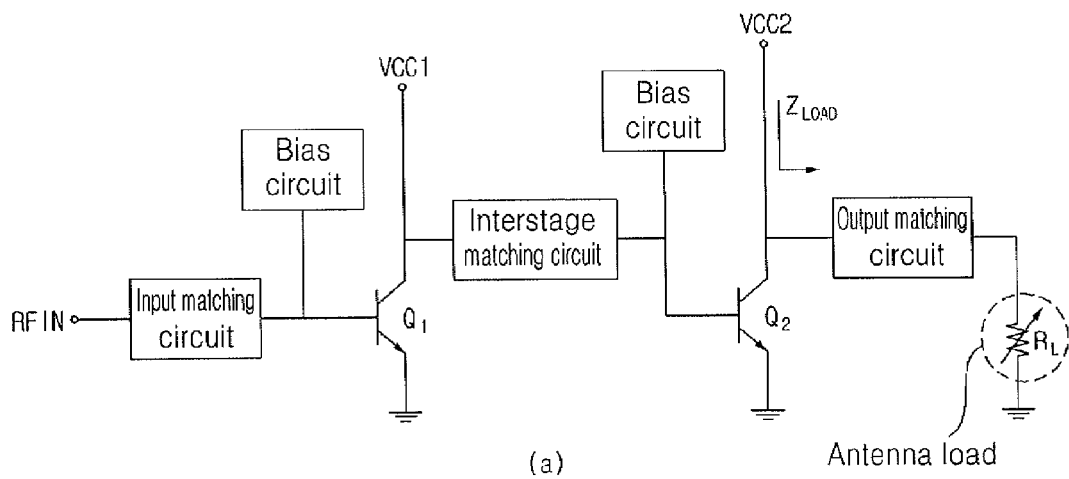
(a)
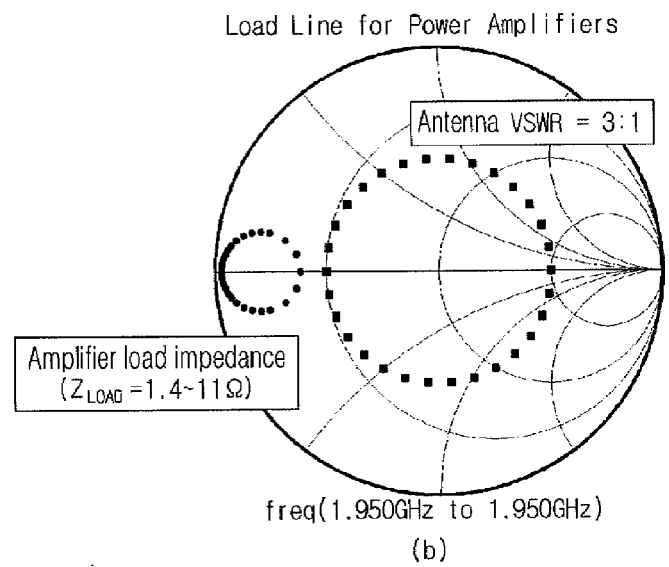
(b)

Fig. 7
S12 = α = 0.0244−j0.9618
S13 = β = 0.1942+j0.0136
S14 = γ = −0.1038−j0.0173
S22=S33=S44
=−0.064−j0.0286
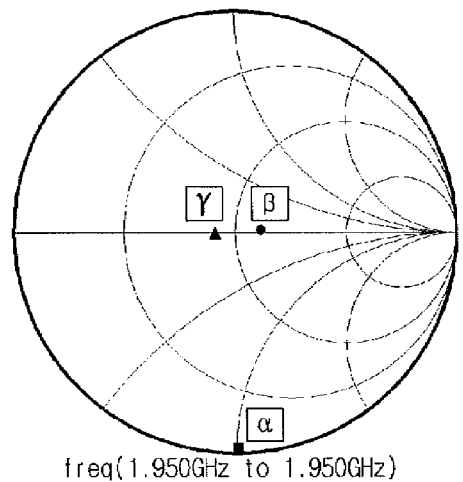
freq(1.950GHz to 1.950GHz)
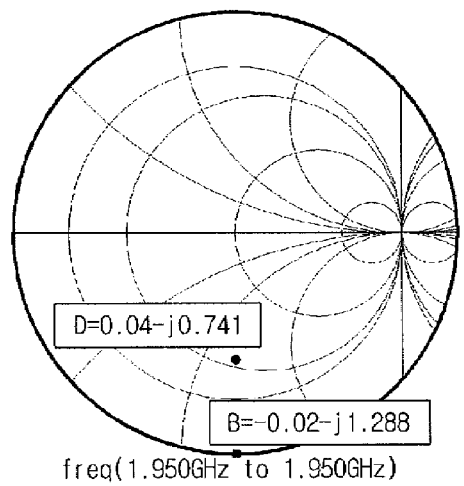
freq(1.950GHz to 1.950GHz)
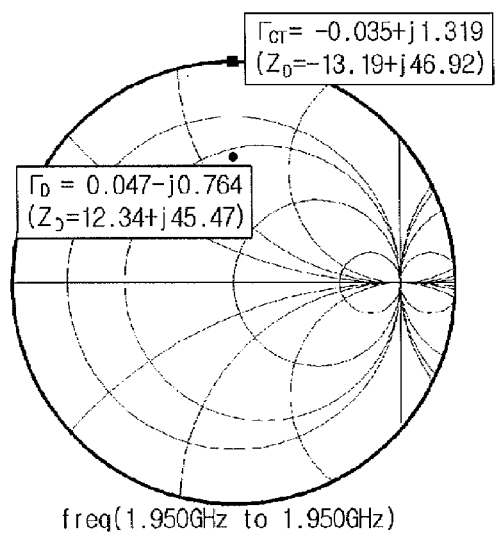
freq(1.950GHz to 1.950GHz)

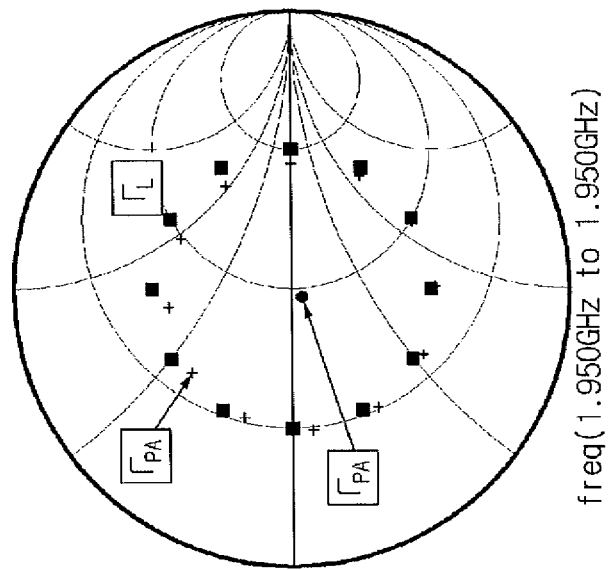
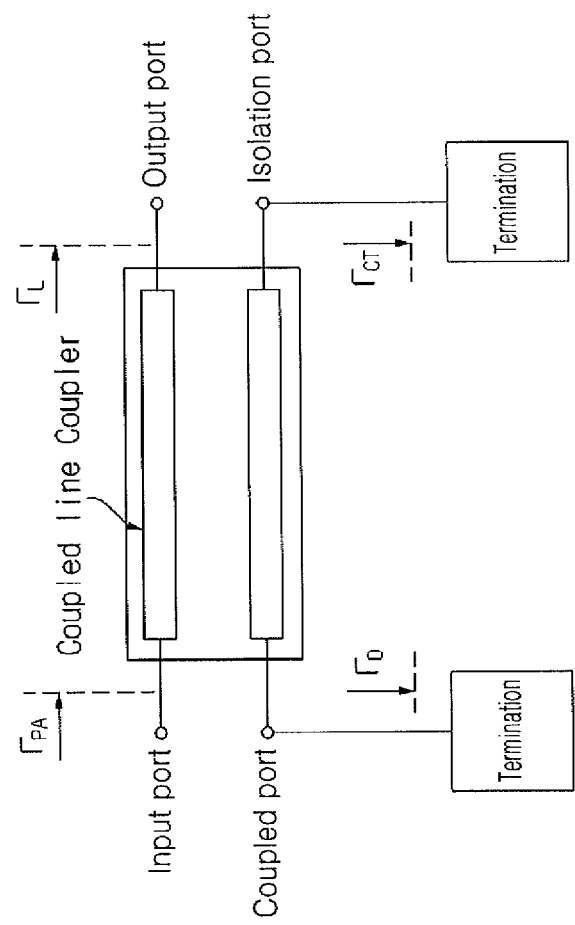
Fig. 8

Fig. 10
Calculated impedance termination
- Coupled port termination
  Resistance = 24.5Ω
  Inductance = 3.16nH
- Isolation port termination
  Resistance = -27Ω
  Inductance = 3.42nH
→
Changed impedance termination
- Coupled port termination
  Resistance = 24.5Ω
  Inductance = 3.16nH
- Isolation port termination
  Resistance = -26Ω
  Inductance = 3.42nH
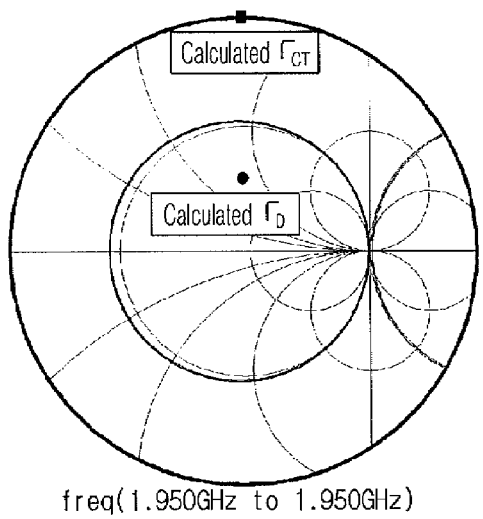
freq(1.950GHz to 1.950GHz)
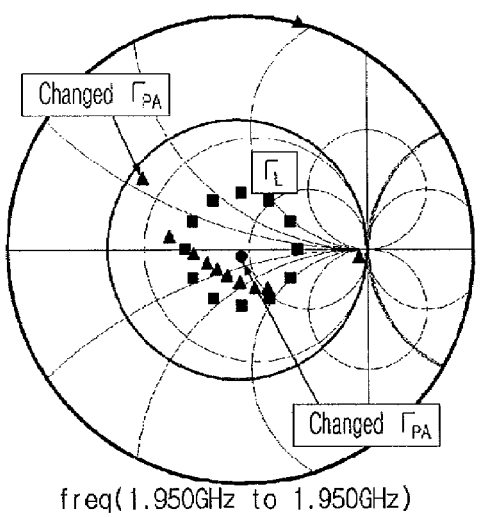
freq(1.950GHz to 1.950GHz)

Fig. 13

| freq | C1, C2 and C3 respectively calculated according to Formulae 10, 15 and 16 | | | Each term calculated for insertion loss in Formula 17 | | | Insertion loss according to Formula 17 |
|---|---|---|---|---|---|---|---|
| | SP1.C1 | SP1.C3 | SP1.C4 | SP1.C1*S(2,2) | SP1.C3*S(2,3) | SP1.C4*S(2,4) | IL |
| Phi_rho=0.000 1.950GHz | 5.768E-17/-153.833 | 9.490/-97.222 | 0.203/-72.415 | 4.049E-18/50.254 | 0.999/92.234 | 0.040/-68.399 | 3.108E-6/2.351 |
| Phi_rho=10.000 1.950GHz | 9.623E-17/-133.946 | 9.474/-97.249 | 0.194/-72.245 | 4.049E-18/50.254 | 0.999/92.207 | 0.038/-68.230 | 3.104E-6/2.300 |
| Phi_rho=20.000 1.950GHz | 1.602E-16/-129.170 | 9.459/-97.292 | 0.185/-72.512 | 4.049E-18/50.254 | 0.996/92.164 | 0.036/-68.496 | 3.100E-6/2.236 |
| Phi_rho=30.000 1.950GHz | 5.680E-17/-93.795 | 9.445/-97.349 | 0.176/-73.278 | 4.049E-18/50.254 | 0.995/92.107 | 0.034/-68.262 | 3.097E-6/2.161 |
| Phi_rho=40.000 1.950GHz | 1.158E-16/127.974 | 9.433/-97.420 | 0.168/-74.603 | 4.049E-18/50.254 | 0.993/92.036 | 0.033/-70.587 | 3.094E-6/2.077 |
| Phi_rho=50.000 1.950GHz | 8.351E-17/163.679 | 9.423/-97.503 | 0.161/-76.529 | 4.049E-18/50.254 | 0.992/91.953 | 0.031/-72.513 | 3.093E-6/1.985 |
| Phi_rho=60.000 1.950GHz | 1.010E-16/-139.184 | 9.416/-97.595 | 0.155/-79.060 | 4.049E-18/50.254 | 0.991/91.860 | 0.030/-75.044 | 3.092E-6/1.888 |
| Phi_rho=70.000 1.950GHz | 2.483E-167/176.611 | 9.411/-97.696 | 0.150/-82.142 | 4.049E-18/50.254 | 0.991/91.760 | 0.029/-78.126 | 3.092E-6/1.788 |

Fig. 16

| freq | C1 | C3 | C4 | C1*S(2.2) | C3*S(2.3) | C4*S(2.4) | IL |
|---|---|---|---|---|---|---|---|
| Phi_rho=0.000 1.950GHz | 1.159E-16/23.870 | 0.065/-13.553 | 8.713/86.928 | 7.154E-18/-141.007 | 0.999/92.234 | 0.040/-68.399 | 0.972/30.970 |
| Phi_rho=15.000 1.950GHz | 6.289E-17/-154.114 | 0.078/-12.852 | 8.703/86.910 | 3.882E-18/41.008 | 0.999/92.207 | 0.038/-68.230 | 0.971/30.942 |
| Phi_rho=30.000 1.950GHz | 1.261E-16/130.453 | 0.092/-10.269 | 8.694/86.876 | 7.785E-18/-34.425 | 0.996/92.164 | 0.036/-68.496 | 0.970/30.897 |
| Phi_rho=45.000 1.950GHz | 2.043E-16/-154.675 | 0.104/-6.540 | 8.687/86.828 | 1.261E-17/40.448 | 0.995/92.107 | 0.034/-68.262 | 0.969/30.897 |
| Phi_rho=60.000 1.950GHz | 1.175E-16/-97.709 | 0.115/-2.057 | 8.681/86.768 | 7.253E-18/97.414 | 0.993/92.036 | 0.033/-70.587 | 0.968/30.837 |
| Phi_rho=75.000 1.950GHz | 1.148E-16/-68.883 | 0.125/2.959 | 8.678/86.700 | 7.087E-18/126.239 | 0.992/91.953 | 0.031/-72.513 | 0.968/30.685 |

C1, C2 and C3 calculated according to Embodiment 3

Each term calculated for insertion loss in Embodiment 3

Insertion loss according to Embodiment 3

POWER AMPLIFIER INSENSITIVE TO LOAD IMPEDANCE CHANGES

This is a National Phase Application filed under 35 U.S.C. 371 as a national stage of PCT/KR2010/000733, filed Feb. 5, 2010, and claims priority from Korean Application No. 10-2010-0006984, filed Jan. 26, 2010, the content of each of which is hereby incorporated by reference in its entirety.

TECHNICAL FIELD

The present invention relates to a power amplifier, and more particularly, to a power amplifier insensitive to change in load impedance.

BACKGROUND ART

A power amplifier used in a transmitter of a mobile terminal is designed and sold so as to obtain optimal performance when antenna load impedance is specific impedance (e.g., 50 ohms). Referring to FIG. 1 showing a circuit of a general power amplifier, assuming that antenna load impedance $R_L$ is 50 ohms, a power amplification circuit and an output matching circuit are designed. Impedance $Z_{LOAD}$ toward an antenna load from an output terminal of the power amplification circuit (hereinafter, referred to as 'amplifier load impedance' to be distinguished from the antenna load impedance) is a major parameter for determining the performance of the power amplifier, and has important influence on output power, efficiency, linearity and the like of the power amplifier.

However, when used in practice, the antenna load impedance of the power amplifier does not become 50 ohms and is extremely variable depending on a user and ambient environment. The change in the antenna load impedance results in change in the amplifier load impedance $Z_{LOAD}$, and therefore, many problems occurs such as deterioration of the performance of the power amplifier, an increase in the power consumption of the mobile terminal and a reduction in battery lifespan.

DISCLOSURE OF INVENTION

Technical Problem

FIG. 2 is a reference view illustrating amplifier load impedance $Z_{LOAD}$ when antenna load impedance is 50 ohms, which is ideal, and FIG. 3 is a reference view illustrating change in the amplifier load impedance $Z_{LOAD}$ when the antenna load impedance is not 50 ohms but is temporarily changed.

FIG. 2 (a) shows an output matching circuit for forming the amplifier load impedance, and FIG. 2 (b) shows a Smith chart representing the antenna load impedance and the amplifier load impedance $Z_{LOAD}$. Referring to FIG. 2 (b), when the antenna load impedance is matched to reference impedance, i.e., when the antenna load impedance is fixed to 50 ohms, the amplifier load impedance $Z_{LOAD}$ is fixed to 4 ohms to form a constant load line.

FIG. 3 (a) shows a circuit diagram of a power amplifier in which the antenna load impedance is represented as a variable resistor, and FIG. 3 (b) is a Smith chart representing the amplifier load impedance $Z_{LOAD}$ when the voltage standing wave ratio (VSWR) of the antenna load impedance is changed as 3:1. Referring to FIG. 3 (b), as the VSWR of the antenna load impedance is changed as 3:1, the amplifier load impedance $Z_{LOAD}$ does not become 4 ohms but is extremely changed from about 1.4 to 11 ohms as shown in FIG. 2 (b).

Therefore, the performance of the power amplifier is deteriorated, and the power consumption of a battery of the mobile terminal is increased.

Accordingly, an aspect of the present invention is to provide a power amplifier in which change in amplifier load impedance $Z_{LOAD}$ is minimized in spite of change in antenna load impedance, whereby it is possible to prevent deterioration of the performance of the power amplifier and an increase in the power consumption of a battery of a mobile terminal and to maintain constant total radiated power (TRP) in a transmitter of the mobile terminal.

Technical Solution

In accordance with an aspect of the present invention, there is provided a power amplifier including: a power amplification circuit which amplifies an input signal; an output matching circuit connected to an output terminal of the power amplification circuit to perform impedance matching between the power amplification circuit and an antenna load; and a 4-port coupler connected between the output matching circuit and the antenna load.

Here, an input port of the 4-port coupler may be connected to the output matching circuit, an output port of the 4-port coupler may be connected to the antenna load, and predetermined impedance elements may be respectively connected to coupled and isolation ports of the 4-port coupler.

Further, the impedance elements may be determined such that the reflection coefficients $\Gamma_D$ and $\Gamma_{CT}$ of the coupled and isolation ports of the 4-port coupler satisfy the following formula:

$$D = -\frac{\alpha\gamma}{\beta}$$

$$\Gamma_D = \frac{1}{B + S33}$$

$$B = -\frac{\alpha\beta}{\gamma}$$

$$\Gamma_{CT} = \frac{1}{D + S44},$$

wherein $\alpha$, $\beta$ and $\gamma$ have the following relationships with parameters S when the impedance of each of the coupled and isolation ports of the 4-port coupler is matched to 50 ohms:

$S21 = S12 = S34 = S43 = \alpha$ $S31 = S13 = S24 = S42 = \beta$ $S32 = S23 = S14 = S41 = \gamma$.

Furthermore, the impedance elements may be determined such that the reflection coefficients $\Gamma_D$ and $\Gamma_{CT}$ of the coupled and isolation ports of the 4-port coupler satisfy the following formula:

$$D = \frac{\beta^2}{A}$$

$$\Gamma_D = \frac{1}{B + S33}$$

$$B = \frac{\alpha(\alpha^2 - \beta^2 - \gamma^2) - D \cdot \beta \cdot \gamma}{\alpha D + \beta\gamma}$$

$$\Gamma_{CT} = \frac{1}{D + S44},$$

wherein A has the following relationship with a reflection coefficient $\Gamma_L$ toward the antenna load from the output port of the 4-port coupler, $$A = \frac{1 - S22 \cdot \Gamma_L}{\Gamma_L};$$

and
wherein $\alpha$, $\beta$ and $\gamma$ have the following relationships with parameters S when the impedance of each of the coupled and isolation ports of the 4-port coupler is matched to 50 ohms:

$S21=S12=S34=S43=\alpha$ $S31=S13=S24=S42=\beta$ $S32=S23=S14=S41=\gamma$

Here, the incident signals (a1, a2, a3, a4) and the reflection signals (b1, b2, b3, b4) have the following relationship with unique parameters S of the 4-port coupler:

$$\begin{bmatrix} b1 \\ b2 \\ b3 \\ b4 \end{bmatrix} = \begin{bmatrix} S11 & S12 & S13 & S14 \\ S21 & S22 & S23 & S24 \\ S31 & S32 & S33 & S34 \\ S41 & S42 & S43 & S44 \end{bmatrix} \begin{bmatrix} a1 \\ a2 \\ a3 \\ a4 \end{bmatrix}$$

Also, the power amplifier may further comprise a phase adjusting unit for changing a phase of S21 of the 4-port coupler.

Here, the phase adjusting unit may be a phase shifter coupled between the output matching circuit and the input port of the 4-port coupler.

Here, a phase value of the phase shifter may be set such that an insertion loss of the 4-port coupler becomes a value close to 1.

In addition, the 4-port coupler may be implemented using a metamaterial.

Here, a phase of S21 of the 4-port coupler may be set such that the insertion loss of the 4-port coupler becomes a value close to 1, using the metamaterial.

In accordance with another aspect of the present invention, there is provided a power amplifier including a power amplification circuit which amplifies an input signal; an output matching circuit connected to an output terminal of the power amplification circuit to perform impedance matching between the power amplification circuit and an antenna load; a 4-port coupler provided between the output matching circuit and the antenna load; and a phase shifter connected between the output matching circuit and an input port of the 4-port coupler.

Here, the input port of the 4-port coupler may be connected to the phase shifter, an output port of the 4-port coupler may be connected to the antenna load, and predetermined impedance elements may be respectively connected to coupled and isolation ports of the 4-port coupler.

Here, the impedance elements may be determined such that the reflection coefficients $\Gamma_D$ and $\Gamma_{CT}$ of the coupled and isolation ports of the 4-port coupler satisfy the following formula:

$$D = \frac{\beta^2}{A}$$

$$\Gamma_D = \frac{1}{B + S33}$$

$$B = \frac{\alpha(\alpha^2 - \beta^2 - \gamma^2) - D \cdot \beta \cdot \gamma}{\alpha D + \beta \gamma}$$

$$\Gamma_{CT} = \frac{1}{D + S44},$$

wherein A has the following relationship with a reflection coefficient $\Gamma_L$ toward the antenna load from the output port of the 4-port coupler:

$$A = \frac{1 - S22 \cdot \Gamma_L}{\Gamma_L};$$

and
wherein $\alpha$, $\beta$ and $\gamma$ have the following relationships with parameters S when the impedance of each of the coupled and isolation ports of the 4-port coupler is matched to 50 ohms:

$S21=S12=S34=S43=\alpha$ $S31=S13=S24=S42=\beta$ $S32=S23=S14=S41=\gamma$.

Advantageous Effects

According to the present invention, change in amplifier load impedance is minimized using a 4-port coupler despite change in antenna load impedance, thereby making it possible to prevent deterioration of the performance of the power amplifier, to increase in power consumption of a battery of a mobile terminal, and to maintain constant total radiated power (TRP) in a transmitter of the mobile terminal.

DESCRIPTION OF DRAWINGS

FIG. 2 is a reference view illustrating amplifier load impedance $Z_{LOAD}$ when antenna load impedance is 50 ohms, which is ideal;

FIG. 3 is a reference view illustrating change in the amplifier load impedance $Z_{LOAD}$ when the antenna load impedance is not 50 ohms but is temporarily changed;

FIG. 7 shows a result obtained by displaying on a Smith chart $\alpha$, $\beta$, $\gamma$, B, D, $\Gamma_D$ and $\Gamma_{CT}$, which are determined according to previously given parameters S of the 4-port coupler;

FIG. 8 shows a simulation result of $\Gamma_{PA}$ as antenna load impedance is changed according to the first embodiment of the present invention;

FIG. 10 is a reference view illustrating a problem that may occur in the first embodiment;

FIG. 13 is a table showing values obtained by calculating insertion loss (IL) of the 4-port coupler according to the change in the antenna load impedance when the coupled and isolation ports are terminated according to the second embodiment of the present invention;

FIG. 16 is a table showing values obtained by calculating insertion loss of the 4-port coupler according to the change in the antenna load impedance when the phase of the phase shifter is set to 60°.

BEST MODE

Figure 1:
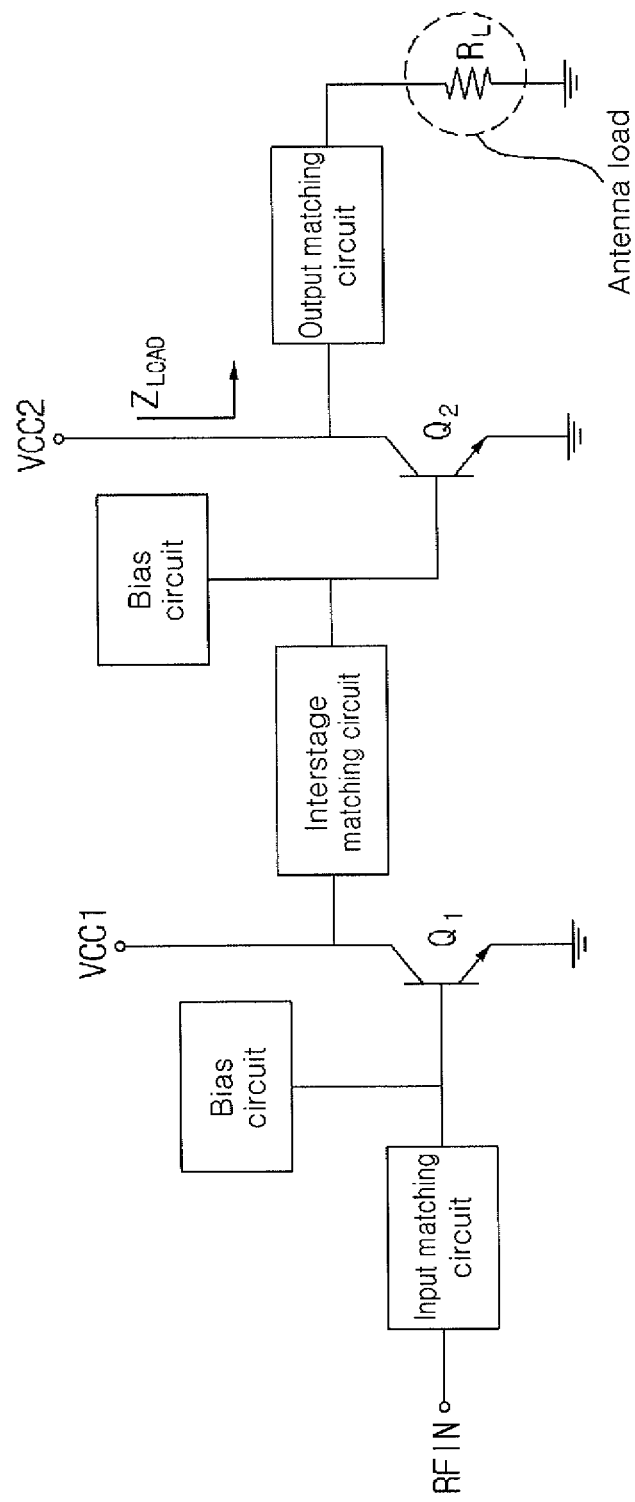
FIG. 1 is a circuit diagram of a general power amplifier.

Exemplary embodiments of the present invention will now be described with reference to the accompanying drawings. Herein, like components will be denoted by like reference numerals throughout the specification and the drawings. Elaboration of functions or features apparent to those skilled in the art will be omitted for clarity of description of the present invention.

Figure 4:
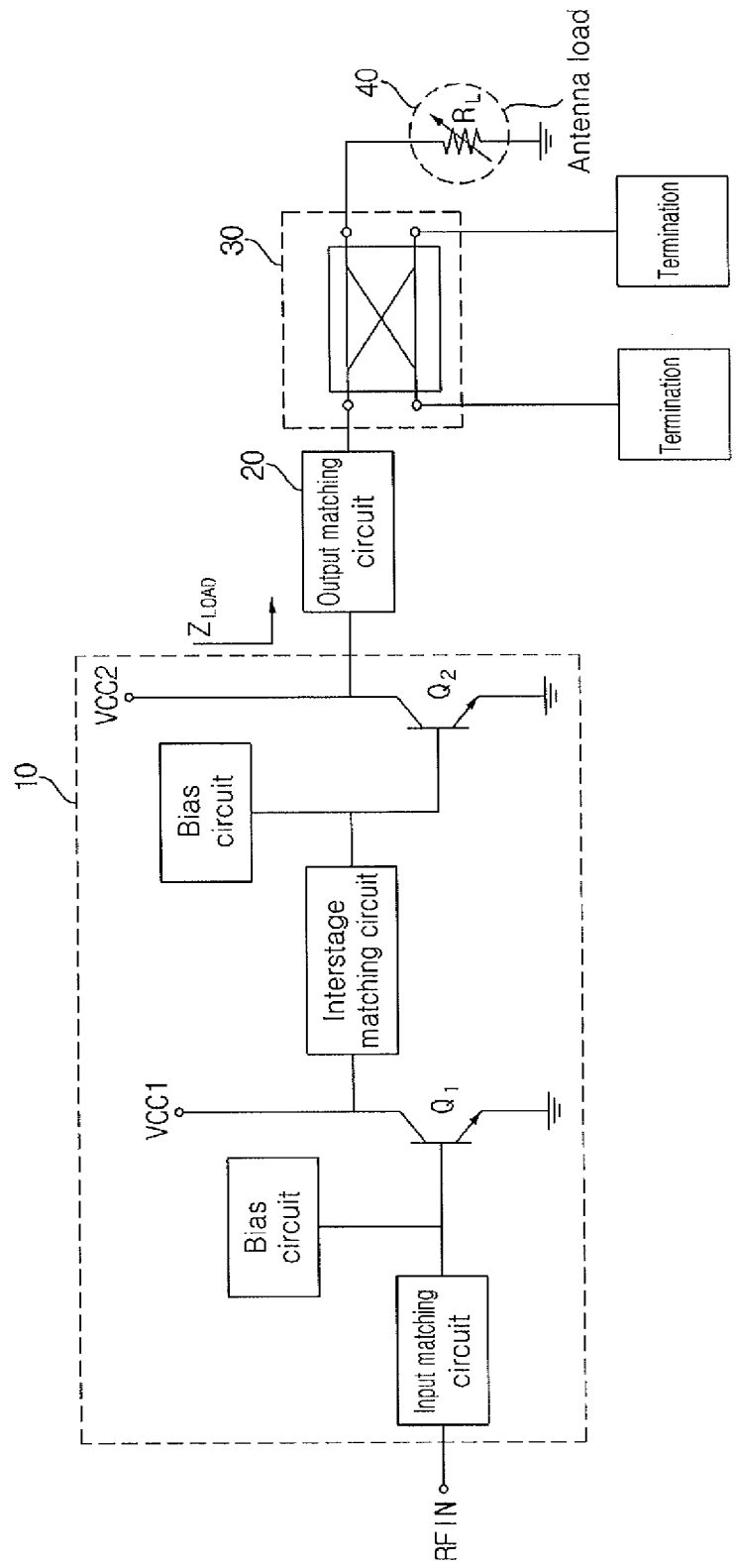
FIG. 4 is a circuit diagram of a power amplifier according to an embodiment of the present invention.

FIG. 4 is a circuit diagram of a power amplifier according to one embodiment of the present invention.

The power amplifier according to this embodiment includes a power amplification circuit 10 for amplifying an input signal, an output matching circuit 20 connected to an output terminal of the power amplification circuit 10 to perform impedance matching between the power amplification circuit 10 and an antenna load 40, and a 4-port coupler 30 connected between the output matching circuit 20 and the antenna load 40.

The 4-port coupler 30 is an RF coupler with four ports and has a first port that is an input port, a second port that is an output port, a third port that is a coupled port, and a fourth port that is an isolation port. As shown in this figure, the input port is connected to the output matching circuit 20, and the output port is connected to the antenna load 40. Predetermined impedance elements are respectively connected as terminations to the coupled port and the isolation port.

According to this embodiment, the impedance elements each having an appropriate impedance are connected to the respective coupled and isolation ports of the 4-port coupler 30, so that although antenna load impedance is changed, constant output impedance can be obtained as will be described later.

Figure 5:
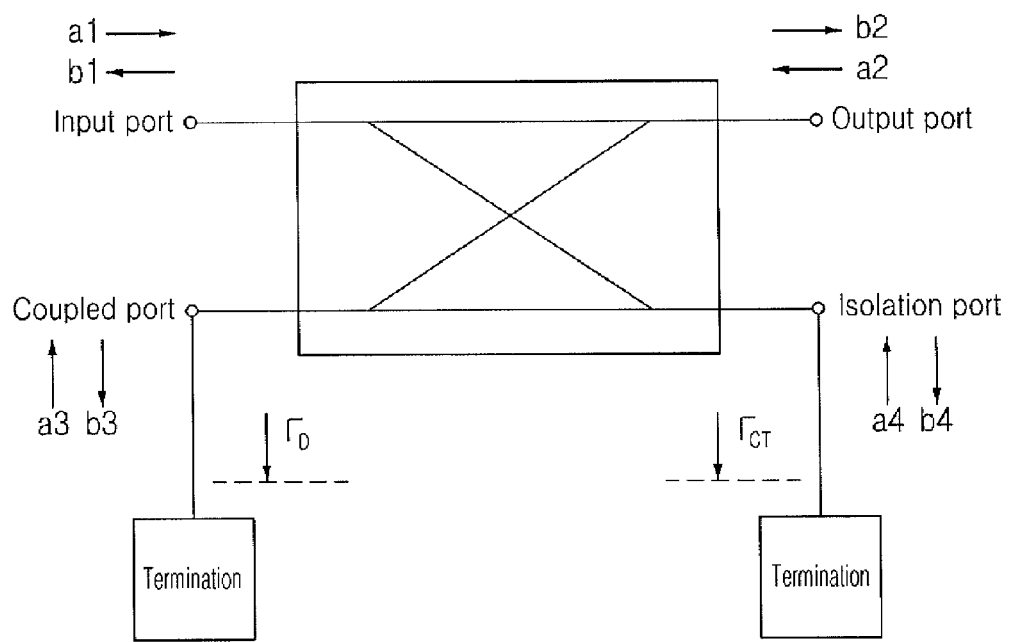
FIG. 5 shows a circuit in which impedance elements are respectively connected to coupled and isolation ports of a 4-port coupler.

FIG. 5 shows a circuit in which the impedance elements are connected to the respective coupled and isolation ports of the 4-port coupler. The letters 'a' and 'b' represented for each port designate an incident wave and a reflection wave, respectively. As shown in this figure, an RF signal a1 is input (or incident) to the input port, and an RF signal b2 is output (or transferred) to the output port. In addition to the input signal a1 and the output signal b2, a signal b1 that is a reflection wave of the incident signal a1 and a signal a2 incident to the output port exist at the input and output ports, respectively. Signals a3 and a4 incident to the ports and signals b3 and b4 reflected from the ports also exist at the coupled and isolation ports, respectively. Referring to FIG. 5, $\Gamma_D$ (=a3/b3) denotes a reflection coefficient toward the termination from the coupled port, and $\Gamma_{CT}$ (=a4/b4) denotes a reflection coefficient toward the termination from the isolation port.

The relationships between the signals a11 to a4 and b1 to b4 are expressed as shown in the following formula, using unique parameters S of the 4-port coupler:

$$\begin{bmatrix} b1 \\ b2 \\ b3 \\ b4 \end{bmatrix} = \begin{bmatrix} S11 & S12 & S13 & S14 \\ S21 & S22 & S23 & S24 \\ S31 & S32 & S33 & S34 \\ S41 & S42 & S43 & S44 \end{bmatrix} \begin{bmatrix} a1 \\ a2 \\ a3 \\ a4 \end{bmatrix} \quad \text{Formula 1}$$

In the case where matching is performed by respectively connecting impedance elements of 50 ohms to the coupled and isolation ports of the 4-port coupler, $\Gamma_D=0$ and $\Gamma_{CT}=0$ (i.e., a3=0 and a4=0), and Formula 1 may be expressed as follows:

$$\begin{bmatrix} b1 \\ b2 \\ b3 \\ b4 \end{bmatrix} = \begin{bmatrix} S11 & S12 & S13 & S14 \\ S21 & S22 & S23 & S24 \\ S31 & S32 & S33 & S34 \\ S41 & S42 & S43 & S44 \end{bmatrix} \begin{bmatrix} a1 \\ a2 \\ 0 \\ 0 \end{bmatrix} \quad \text{Formula 2}$$

In this case, the insertion loss (IL) and coupled power (CP) of the 4-port coupler are represented as shown in the following formula:

$$IL = \frac{b2}{a1} = S21 + S22\frac{a2}{a1} \quad \text{Formula 3}$$

$$CP = \frac{b3}{a1} = S31 + S32\frac{a3}{a1}.$$

Figure 6:
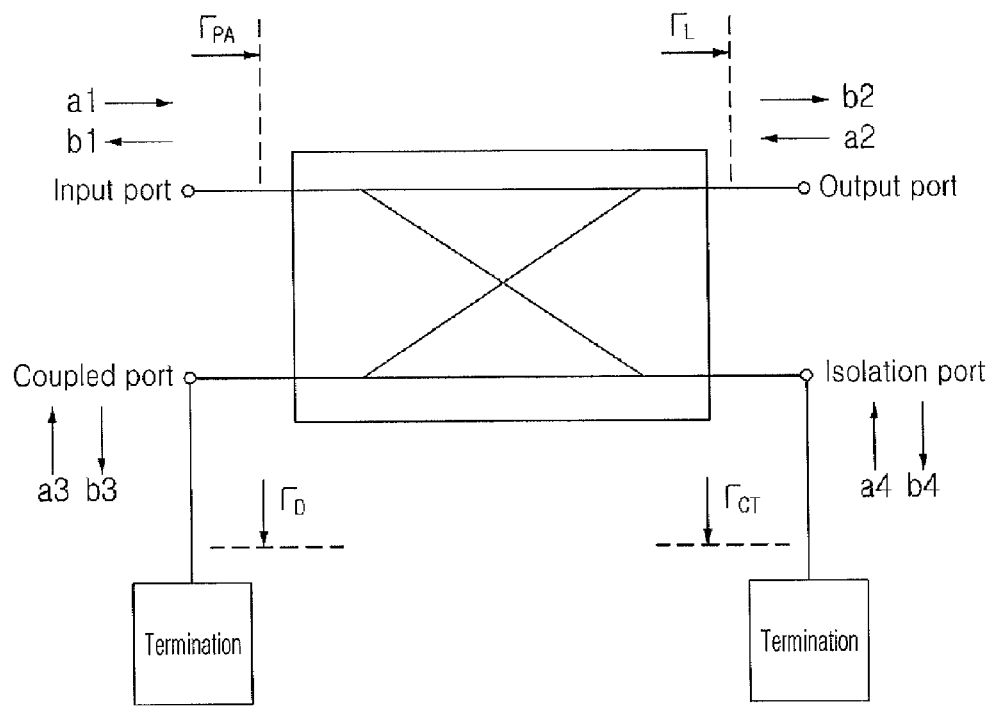
FIG. 6 is a circuit diagram illustrating a method of determining the impedance of the impedance elements connected to the respective coupled and isolation ports of the 4-port coupler according to a first embodiment of the present invention.

FIG. 6 is a circuit diagram illustrating a method of determining the impedance of the impedance elements connected to the respective coupled and isolation ports of the 4-port coupler 30 according to a first embodiment of the present invention. Referring to FIG. 6, $\Gamma_{P4}$ (=b1/a1) denotes a reflection coefficient at the input port of the 4-port coupler 30. Since the input port of the 4-port coupler 30 is connected to the output matching circuit 20 of the power amplifier as described above, $\Gamma_{P4}$ (=b1/a1) ultimately denotes change in impedance toward the antenna load from the power amplifier. $\Gamma_L$ (=a2/b2) denotes a reflection coefficient at the output port of the 4-port coupler 30. Since the output port of the 4-port coupler 30 is connected to the antenna load 40 as described above, $\Gamma_L$ (=a2/b2) denotes change in antenna load impedance.

Formula 1 may be differently expressed as follows:

$$b1 = S11 \cdot a1 + S12 \cdot a2 + S13 \cdot a3 + S14 \cdot a4$$

$$b2 = S21 \cdot a1 + S22 \cdot a2 + S23 \cdot a3 + S24 \cdot a4$$

$$b3 = S31 \cdot a1 + S32 \cdot a2 + S33 \cdot a3 + S34 \cdot a4$$

$$b4 = S41 \cdot a1 + S42 \cdot a2 + S43 \cdot a3 + S44 \cdot a4 \quad \text{Formula 4}$$

In the case where $\Gamma_D$ and $\Gamma_{CT}$ are not zero, $\Gamma_L$, $\Gamma_D$ and $\Gamma_{CT}$ are expressed as follows, using the parameters S:

$$\frac{1}{\Gamma_L} = \frac{b2}{a2} = S21 \cdot \frac{a1}{a2} + S22 + S23 \cdot \frac{a3}{a2} + S24 \cdot \frac{a4}{a2}$$ Formula 5

$$\frac{1}{\Gamma_D} = \frac{b3}{a3} = S31 \cdot \frac{a1}{a3} + S32 \cdot \frac{a2}{a3} + S33 + S34 \cdot \frac{a4}{a3}$$

$$\frac{1}{\Gamma_{CT}} = \frac{b4}{a4} = S41 \cdot \frac{a1}{a4} + S42 \cdot \frac{a2}{a4} + S43 \cdot \frac{a3}{a4} + S44.$$

For convenience of illustration, the ratios of the signals a2, a3 and a4 to the signal a1, i.e., a2/a1, a3/a1 and a4/a1 will be defined as C1, C3 and C4, respectively:

$$C1 = \frac{a2}{a1}$$ Formula 6

$$C3 = \frac{a3}{a1}$$

$$C4 = \frac{a4}{a1}.$$

Using Formula 6, Formula 5 is rearranged as follows:

$$\frac{1 - S22 \cdot \Gamma_L}{\Gamma_L} = \frac{S21 + S23 \cdot C3 + S24 \cdot C4}{C1}$$ Formula 7

$$\frac{1 - S33 \cdot \Gamma_D}{\Gamma_D} = \frac{S31 + S32 \cdot C1 + S34 \cdot C4}{C3}$$

$$\frac{1 - S44 \cdot \Gamma_{CT}}{\Gamma_{CT}} = \frac{S41 + S42 \cdot C1 + S43 \cdot C3}{C4}.$$

Assuming that the 4-port coupler is reciprocal, in the case where each of the coupled and isolation ports are matched to 50 ohms, the following formula is established between parameters S of the 4-port coupler:

$$S21 = S12 = S34 = S43 = \alpha$$

$$S31 = S13 = S24 = S42 = \beta$$

$$S32 = S23 = S14 = S41 = \gamma.$$ Formula 8

The left side of Formula 7 will be defined as follows:

$$\frac{1 - S22 \cdot \Gamma_L}{\Gamma_L} = A$$ Formula 9

$$\frac{1 - S33 \cdot \Gamma_D}{\Gamma_D} = B$$

$$\frac{1 - S44 \cdot \Gamma_{CT}}{\Gamma_{CT}} = D.$$

As defined in Formula 9, the variable A denotes change in the antenna load impedance, the variable B denotes a reflection coefficient at the coupled port, and the variable D denotes a reflection coefficient at the isolation port. Using A, B and D, Formula 7 is expressed as follows:

$$C1 \cdot A = \alpha + \gamma \cdot C3 + \beta \cdot C4$$

$$C3 \cdot B = \beta + \gamma \cdot C1 + \alpha \cdot C4$$

$$C4 \cdot D = \gamma + \beta \cdot C1 + \alpha \cdot C3$$ Formula 10

If C1, C3 and C4 are expressed as numerators and denominators as shown in Formula 11 and Formula 10 is then rearranged with respect to C1, C3 and C4, their solutions may be obtained as shown in Formula 12:

$$C1 = \frac{C1\_num}{C1\_den}$$ Formula 11

$$C3 = \frac{C3\_num}{C3\_den}$$

$$C4 = \frac{C4\_num}{C4\_den}$$

and $$C1\_num = B(\alpha BD - \alpha^3 + \beta\gamma D + \alpha\gamma^2 + \alpha\beta^2 + \beta\gamma B)$$

$$C1\_den = (AB - \gamma^2)(BD - \alpha^2) - (\beta B + \alpha\gamma)^2$$

$$C3\_num = D(\beta AD - \beta^3 + \alpha\gamma A + \beta\gamma^2 + \alpha^2\beta + \alpha\gamma D)$$

$$C3\_den = (BD - \alpha^2)(AD - \beta^2) - (\gamma D + \alpha\beta)^2$$

$$C4\_num = A(\gamma AB - \gamma^3 + \alpha\beta B + \beta^2\gamma + \alpha^2\gamma + \alpha\beta A)$$

$$C4\_den = (AD - \beta^2)(AB - \gamma^2) - (\alpha A + \beta\gamma)^2.$$ Formula 12

In Formula 9, $\Gamma_D$ and $\Gamma_{CT}$ are parameters which can be designed depending on the impedances of the terminations of the coupled and isolation ports of the 4-port coupler. To keep the amplifier load impedance $Z_{LOAD}$ constant, $\Gamma_D$ and $\Gamma_{CT}$ are appropriately adjusted so that although $\Gamma_L$ (or the variable A) representing the change in the antenna load impedance is changed, $\Gamma_{PA}$ representing the impedance toward the antenna load from the power amplifier is not changed. The adjustment of $\Gamma_D$ and $\Gamma_{CT}$ is the same as the determination of B and D capable of minimizing C1, C3 and C4.

One of these solutions satisfies the following Formulae 13 and 14:

$$\frac{\partial C1}{\partial A} = 0 ==> B \cdot D = \alpha^2 \text{ and}$$ Formula 13

$$\frac{\partial C3}{\partial A} = 0 ==> B \cdot D + \alpha\gamma = 0.$$ Formula 14

If Formulae 13 and 14 are solved, the following solutions may be obtained:

$$D = -\frac{\alpha\gamma}{\beta}$$ Formula 15

$$\Gamma_D = \frac{1}{B + S33}$$

$$B = -\frac{\alpha\beta}{\gamma}$$

$$\Gamma_{CT} = \frac{1}{D + S44}.$$

If the terminations of the coupled and isolation ports of the 4-port coupler satisfy Formula 15, constant output impedance can be obtained in spite of change in the load impedance.

FIG. 7 shows a result obtained by displaying on a Smith chart α, β and γ determined according to the previously given parameters S of the 4-port coupler, and B, D, $\Gamma_D$ and $\Gamma_{CT}$ calculated by Formula 15, at 1.950 GHz.

Referring to FIG. 7, it is determined that $\Gamma_D$=0.047+j0.764 and $\Gamma_{CT}$=0.035+j1.319. In this case, the impedance $Z_D$ of the termination of the coupled port is 12.34+j45.47, and the impedance $Z_{CT}$ of the termination of the isolation port is −13.19+j46.92. The termination of each port may include a negative resistance so as to determine each of $\Gamma_D$ and $\Gamma_{CT}$ as a desired value. The negative resistance may be implemented using a well-known circuit technique using a transistor or the like.

FIG. 8 show a simulation result of $\Gamma_{PA}$ as the antenna load impedance is changed when the impedance $Z_D$ of the termination of the coupled port is 12.34+j45.47, and the impedance $Z_{CT}$ of the termination of the isolation port is −13.19+j46.92 as determined in FIG. 7. Referring to FIG. 8, the points designated by squares represent changes in the antenna load impedance $\Gamma_L$, and the point designated by a circle represents impedance $\Gamma_{PA}$ toward the antenna load from the input port of the 4-port coupler. The points designated by crosses as comparative objects represent impedance $\Gamma_{PA}$ when the impedance of the termination of each of the coupled and isolation ports is matched to 50 ohms. As shown in this figure, in the case where the impedance of the termination of the 4-port coupler is matched to 50 ohms, the output impedance is extremely changed as the antenna load impedance is changed. However, in the case where the impedance of the termination of the 4-port coupler is matched to the impedance of the termination, calculated in FIG. 7, the output impedance is maintained to be a constant value of 50 ohms.

Figure 9:
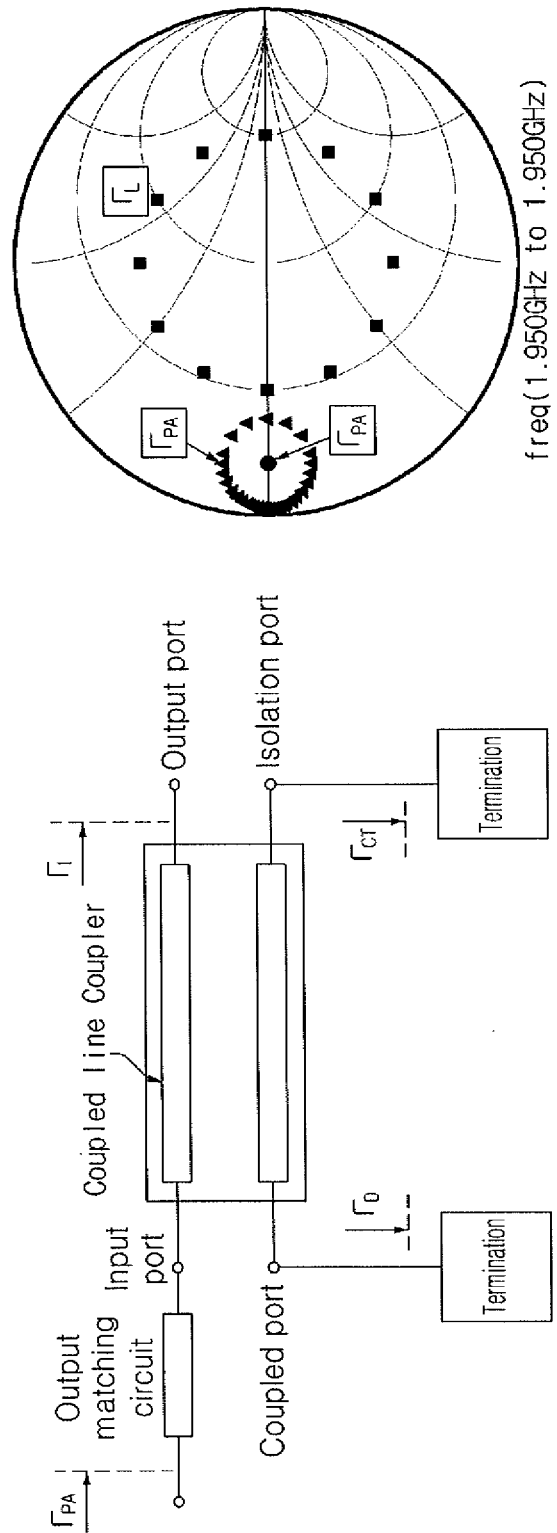
FIG. 9 shows a simulation result obtained in consideration of an output matching circuit of the power amplifier, based on FIG. 8.

FIG. 9 shows a simulation result obtained in consideration of the output matching circuit 20 of the power amplifier, based on FIG. 8. Referring to FIG. 9, a circuit is shown in which a transmission line (of which the characteristic impedance is 13.2 ohms and the electrical length is 90°) that allows the output impedance to be 4 ohms when it is ideal as an equivalent element of the output matching circuit 20 is connected to the input port of the 4-port coupler. The simulation result of impedance $\Gamma_{PA}$ toward the antenna load 40 from the output terminal of the power amplification circuit 10 using the circuit shown in this figure is shown as the point designated by a circle. The points designated by triangles as comparable objects represent impedance $\Gamma_{PA}$ when the impedance of the termination of each of the coupled and isolation ports is matched to 50 ohms. As such, in the case where the output matching circuit 20 is considered, the impedance toward the antenna load 40 from the output terminal of the power amplification circuit 10 is maintained as a constant value of 4 ohms, so that although the antenna load impedance is changed, the characteristics of the power amplifier are maintained constant. Thus, the entire power consumption of the battery is maintained constant.

FIG. 10 is a reference view illustrating a problem that may occur in the first embodiment described above.

As described above, in the first embodiment, $\Gamma_D$ and $\Gamma_{CT}$ are determined using Formula 15, and termination values of the coupled and isolation ports according to the determined $\Gamma_D$ and $\Gamma_{CT}$ are obtained. Here, a phenomenon occurring when an actually implemented termination value is slightly deviated from the exact value obtained by calculation will be described. For example, it is assumed that, as shown in this figure, the resistance of −27.013 ohms in the impedance of −27.013+j41.926 corresponding to $\Gamma_{CT}$ is slightly changed to −26 ohms. Unlike the circuit shown in FIG. 8, the simulation result obtained by setting the resistance to −26 ohms is shown in FIG. 10. Referring to the Smith chart on the right side of FIG. 10, the case where the resistance is an exact value is represented as the point designated by a circle ("calculated $\Gamma_{PA}$" in the center), and the case where the resistance is slightly changed into −26 ohms is presented as the points designated by triangles ("changed $\Gamma_{PA}$"). As such, it can be seen that although the resistance is slightly changed, the change in the output impedance is somewhat serious. Therefore, according to the first embodiment, there is no problem when terminating the coupled and isolation ports as exact values, but there may be a problem in that a desired characteristic cannot be obtained when an error occurs in the value of an actually implemented impedance element.

Hereinafter, to solve such a problem, a method of determining the impedance of an impedance element connected to each of the coupled and isolation ports of the 4-port coupler 30 according to a second embodiment will be described.

As another solution of Formula 12, the solution satisfying the condition of Formula 16 is obtained as shown in Formula 17:

C1_num = 0 & C3_den = max and  Formula 16

$$D = \frac{\beta^2}{A}$$  Formula 17

$$\Gamma_D = \frac{1}{B + S33}$$

$$B = \frac{\alpha(\alpha^2 - \beta^2 - \gamma^2) - D \cdot \beta \cdot \gamma}{\alpha D + \beta \gamma}$$

$$\Gamma_{CT} = \frac{1}{D + S44}.$$

Figure 11:
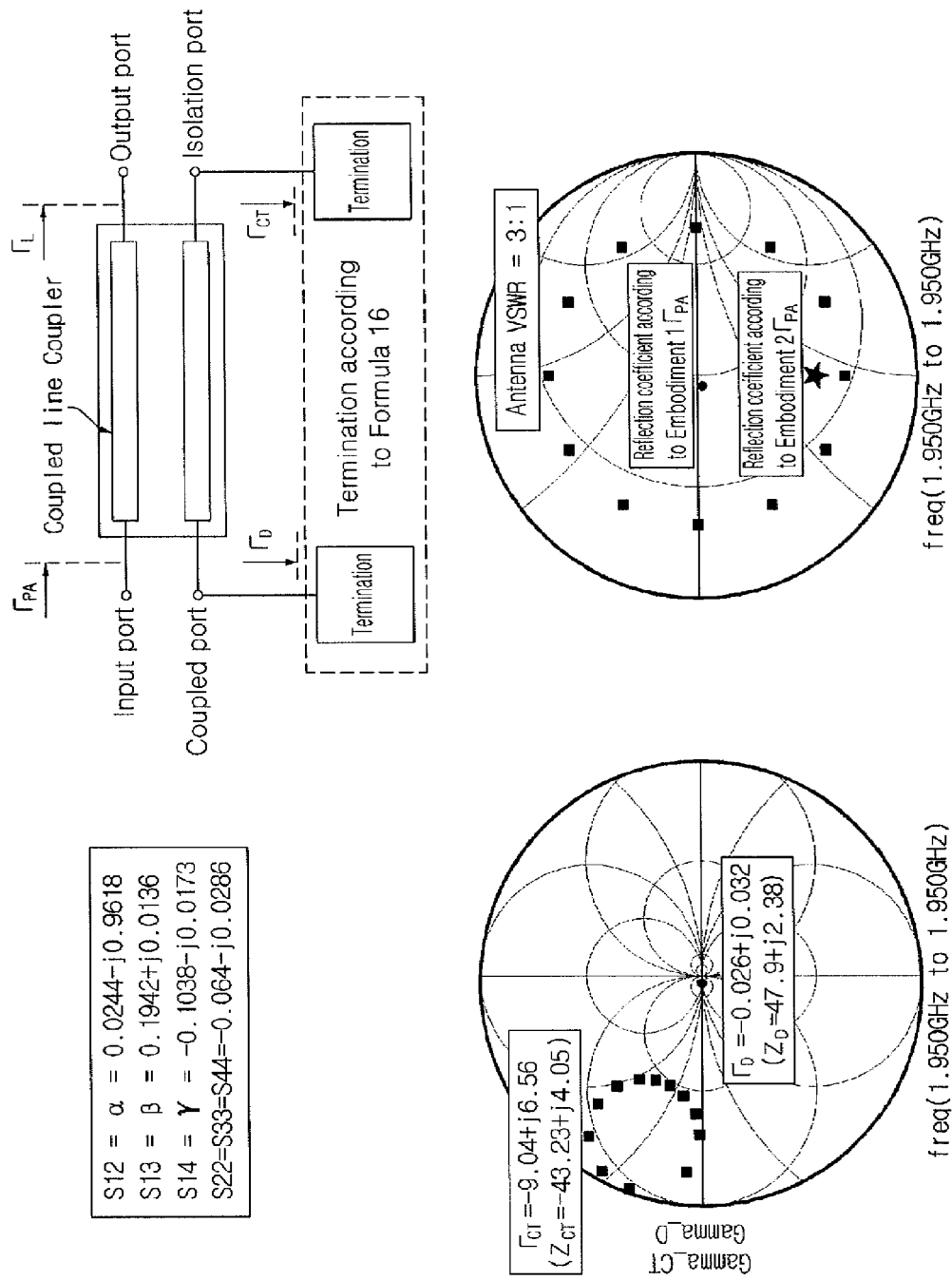
FIG. 11 shows a result simulated using $\Gamma_D$ and $\Gamma_{CT}$ obtained by Formula 16 according to a second embodiment of the present invention.

FIG. 11 shows a result simulated using $\Gamma_D$ and $\Gamma_{CT}$ obtained by Formula 16 according to a second embodiment of the present invention.

Referring to FIG. 11, it is determined that $\Gamma_D$=−0.026+j0.032, and $\Gamma_{CT}$ is $\Gamma_{CT}$=−9.04+j6.56 that is one of several available values. In this case, as shown in FIG. 11, the impedance of 50 ohms is not exactly implemented as in the first embodiment, but the constant impedance or reflection coefficient is obtained although the antenna load is changed while being matched to impedance in the vicinity of 50 ohms.

Figure 12:
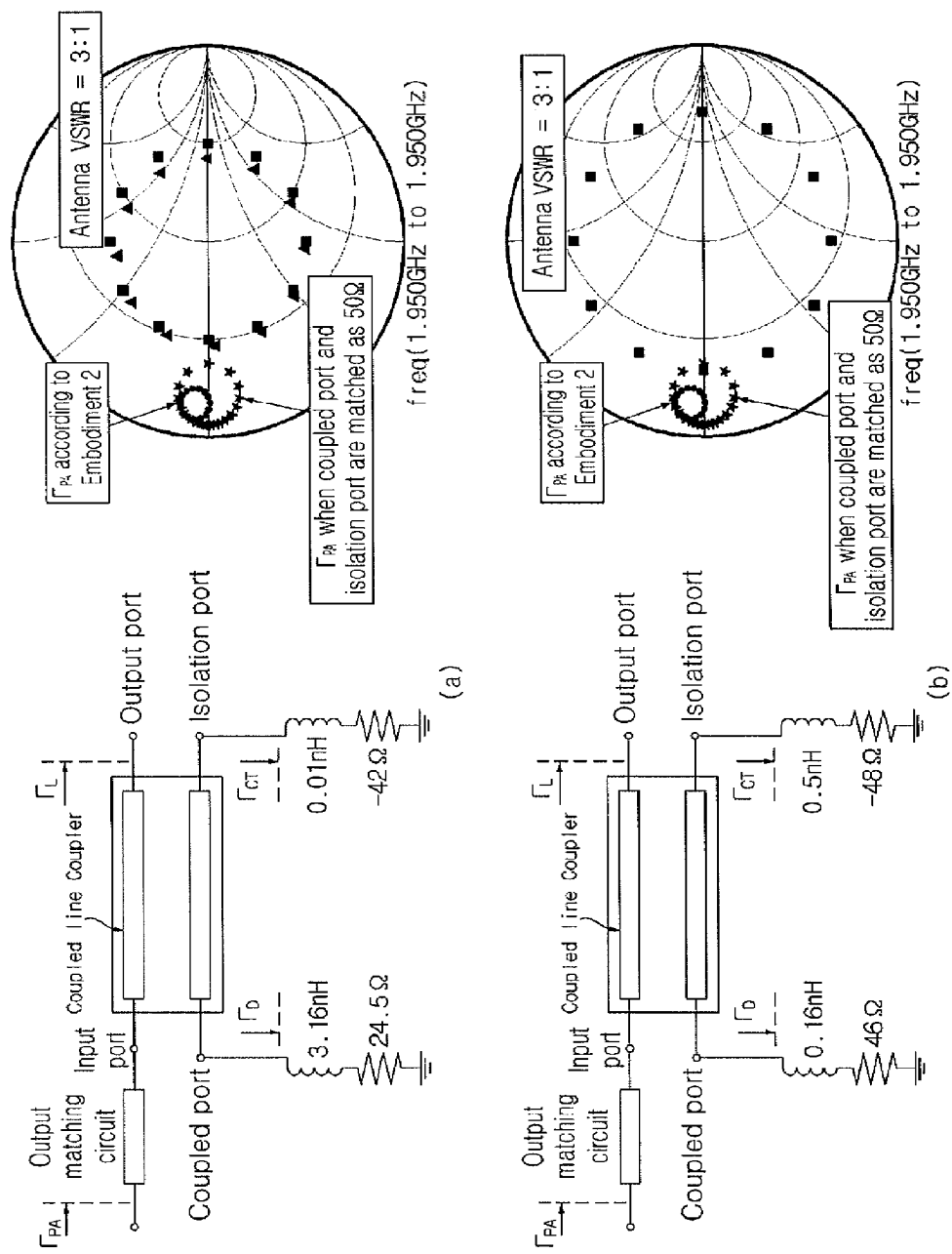
FIG. 12 is a simulation result representing change in $\Gamma_{P4}$ according to the change in impedance of the termination of each of the coupled and isolation ports of the 4-port coupler, calculated according to the second embodiment of the present invention.

FIG. 12 shows a simulation result obtained in consideration of an output matching circuit of the power amplifier, based on FIG. 11. Referring to FIG. 12, a circuit is shown in which a transmission line (of which the characteristic impedance is 13.2 ohms and the electrical length is 90°) that allows the output impedance to be 4 ohms when it is ideal as an equivalent element of the output matching circuit is connected to the input port of the 4-port coupler.

FIG. 12 (a) shows a simulation result of the impedance $\Gamma_{PA}$ toward the antenna load 40 from the output terminal of the power amplification circuit 10 when the inductance and resistance of the inductor and resistor connected to the isolation port are 0.01 nH and −42 ohms, respectively, and the inductance and resistance of the inductor and resistor connected to the coupled port are 3.16 nH and 24.5 ohms, respectively. FIG. 12 (b) shows a simulation result of the impedance $\Gamma_{PA}$ toward the antenna load 40 from the output terminal of the power amplification circuit 10 when the inductance and resistance of the inductor and resistor connected to the isolation port are 0.5 nH and −48 ohms, respectively, and the inductance and resistance of the inductor and resistor connected to the coupled port are 0.16 nH and 45.9 ohms, respectively.

Referring to FIG. 12, it can be seen that the impedance (the points designated by circles) toward the antenna load 40 from the output terminal of the power amplification circuit 10 does not have a constant value when the antenna load impedance (the points designated by squares) is changed, but is changed in a smaller range. The points designated by stars as comparative objects represent change in impedance when the impedance of the termination of each of the coupled and isolation ports is matched to 50 ohms.

However, additional items in actual implementation are necessarily considered in the second embodiment. Referring back to FIG. 6, the output impedance $\Gamma_{PA}$ toward the antenna load from the output terminal of the power amplification circuit 10 in the power amplifier and the entire insertion loss (IL) of the 4-port coupler proposed in the present invention may be ideally expressed as shown in the following formula:

$$\Gamma_{PA} = \frac{b1}{a1}$$
$$= S11 + S12 \cdot C1 + S13 \cdot C3 + S14 \cdot C4 \approx S11$$
$$IL = \frac{b2}{a1}$$
$$= S21 + S22 \cdot C1 + S23 \cdot C3 + S24 \cdot C4 \approx S21.$$

Formula 18

This is because the first and second embodiments have an object to minimize the C1, C3 and C4, and therefore, C1≈0, C3≈0 and C4≈0.

FIG. 13 is a table showing values obtained by calculating insertion loss (IL) of the 4-port coupler according to the change in the antenna load impedance when the coupled and isolation ports are terminated according to the second embodiment of the present invention. In FIG. 13, SP1.C1, SP1.C3 and SP1.C4 respectively mean C1, C3 and C4 calculated according to the second embodiment. Referring to FIG. 13, it can be seen that C1 and C3 have relatively small values but C4 has a considerably large value. Since all of C1, C3 and C4 calculated according to the second embodiment are not small at the same time, the insertion loss (IL) is almost zero as shown in FIG. 13, which means that the input power of the 4-port coupler is entirely lost or reflected, and therefore, power is not transferred to the output of the 4-port coupler, i.e., the antenna. The reason will be described below.

$$\Gamma_{PA} = \frac{b1}{a1}$$
$$= S11 + S12 \cdot C1 + S13 \cdot C3 + S14 \cdot C4 \approx$$
$$S11 + S14 \cdot C4$$
$$IL = \frac{b2}{a1}$$
$$= S21 + S22 \cdot C1 + S23 \cdot C4 + S24 \cdot C4 \approx$$
$$S21 + S24 \cdot C4.$$

Formula 19

In Formula 19, it is satisfied that C1≈0 and C3≈0, but C4 does not become zero. Therefore, only the term S21 must exist in the insertion loss (IL). However, since C4 is not zero as shown in Formula 20, the insertion loss (IL) has almost zero.

$$IL = S21 + S24 \cdot C4 \approx 0$$

Formula 20

According to a third embodiment of the present invention, the phase of S21 of the 4-port coupler is appropriately adjusted so that the insertion loss (IL) does not become zero but has a value close to 1. Thus, it is possible to solve the problem that the output power is not transferred through the 4-port coupler.

A method of adding a phase adjusting unit such as a phase shifter to the input port of the 4-port coupler is used as one method of adjusting the phase of S21 of the 4-port coupler.

Figure 14:
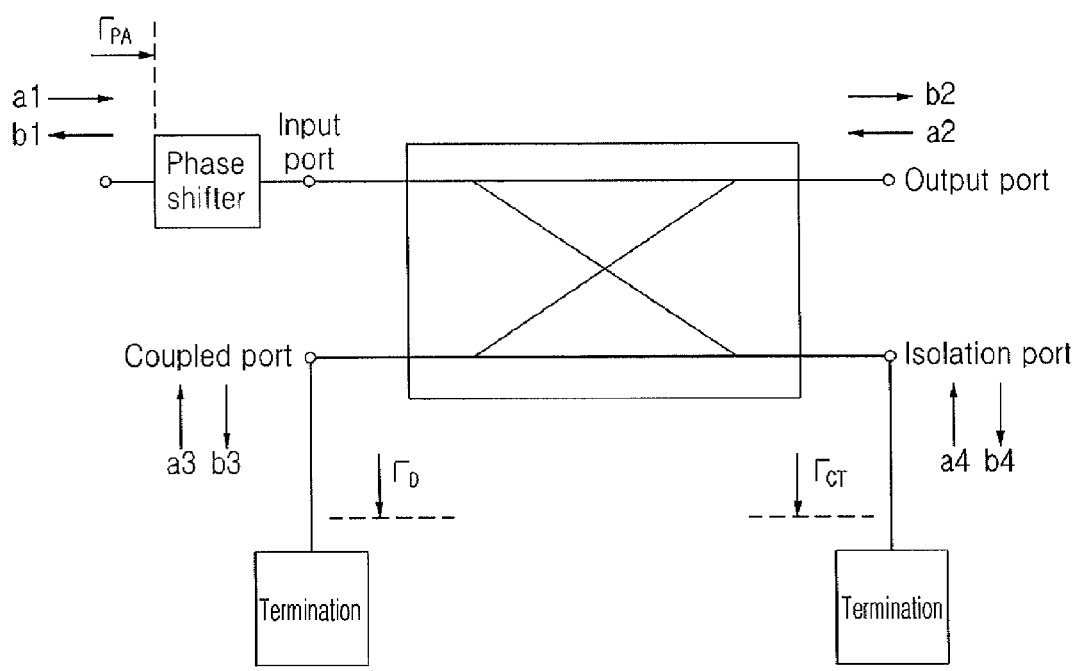
FIG. 14 shows a circuit diagram showing a state in which a phase shifter is connected between the output matching circuit and the 4-port coupler.

FIG. 14 is a circuit diagram showing a state in which a phase shifter is connected between the output matching circuit 20 (not shown in FIG. 14) and the input port of the 4-port coupler 30. That is, the phase shifter is connected between the output terminal of the output matching circuit 20 (not shown in FIG. 14) and the input port of the 4-port coupler 30.

Figure 15:
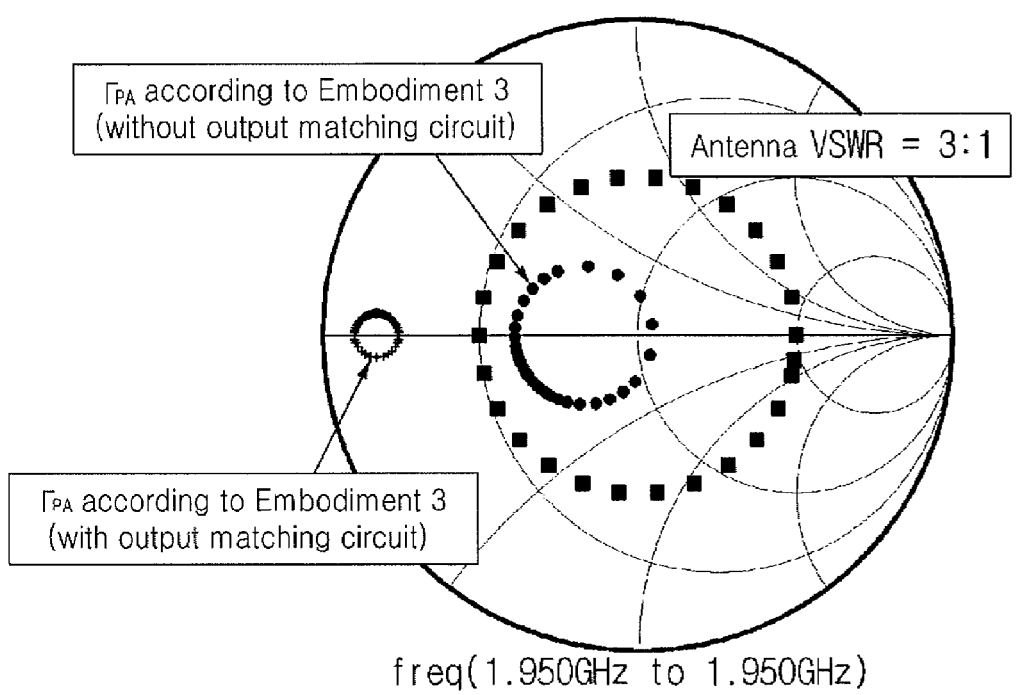
FIG. 15 shows a result obtained by displaying in a Smith chart change in $\Gamma_{P4}$ according to the change in the antenna load impedance when the phase of the phase shifter is set to 60°.

FIG. 15 shows a simulation result of $\Gamma_{PA}$ when the phase of the phase shifter is set to 60°. The appropriated phase value adjusted so that the insertion loss (IL) of the 4-port coupler does not become zero but has a value close to 1 may be obtained using a general simulation tool.

Referring to FIG. 15, the output impedance $\Gamma_{PA}$ (the points designated by circles) toward the antenna load from the input port of the 4-port coupler is changed in a small range in the vicinity of 50 ohms, in spite of the change in the antenna load impedance $\Gamma_L$ (the points designated by squares). In the case where an ideal transmission line (of which the characteristic impedance is 13.2 ohms and the electrical length is 90°) is connected to the input port of the 4-port coupler as the output matching circuit, the impedance $\Gamma_{PA}$ (the points designated by crosses) toward the antenna load 40 from the output terminal of the power amplification circuit 10 is changed in a very small range. Thus, it can be seen that according to the third embodiment, the constant amplifier load impedance can be obtained in spite of the change in the antenna load impedance.

FIG. 16 is a table showing values obtained by calculating insertion loss (IL) of the 4-port coupler according to the change in the antenna load impedance when the phase of the phase shifter is set to 60°. Referring to FIG. 16, it can be seen that the insertion loss is almost 1, which means that almost all of the power amplified in the power amplifier is transferred to the antenna load.

A method of adjusting the phase of S21 of the 4-port coupler itself to a desired value by implementing the 4-port coupler using a metamaterial is used as another method of adjusting the phase of S21. In this case, a separate phase adjusting unit is not required. That is, the phase of S21 of the 4-port coupler may be set such that the insertion loss becomes a value close to 1, using the metamaterial.

Furthermore, a circuit may be implemented, in which change in antenna load impedance is detected to feed back the detected change to a 4-port coupler and a phase adjusting unit, and output impedance adaptively constant to the change in the antenna load impedance is maintained by adjusting the characteristic of the 4-port coupler and the phase value of the phase adjusting unit. Such a circuit will be called an impedance locked loop (ILL).

Some exemplary embodiments have been described above. It will be understood by those skilled in the art that various modifications, variations and alterations can be made without departing from the spirit and scope of the present invention. Therefore, these embodiments are provided for illustration only and should not be construed as limiting the present invention. The scope of the present invention should be interpreted according to the following appended claims as covering all modifications or variations derived from the appended claims and equivalents thereof.

The invention claimed is:

1. A power amplifier comprising:
a power amplification circuit which amplifies an input signal;
an output matching circuit connected to an output terminal of the power amplification circuit configured to perform impedance matching between the power amplification circuit and an antenna load; and
a 4-port coupler connected between the output matching circuit and the antenna load, the 4-port coupler comprising:
an input port having a reflection coefficient $\Gamma_{PA}$ based on an incident signal a1 and a reflection signal b1, an output port having a reflection coefficient $\Gamma_L$ based on an incident signal a2 and a reflection signal b2, a coupled port having a reflection coefficient $\Gamma_D$ based on an incident signal a3 and a reflection signal b3, and an isolation port having a reflection coefficient $\Gamma_{CT}$ based on an incident signal a4 and a reflection signal b4,
wherein the reflection coefficient $\Gamma_D$ and the reflection coefficient $\Gamma_{CT}$ are determined so that the reflection coefficient $\Gamma_{PA}$ is not changed when $\Gamma_L$ is changed.

2. The power amplifier according to claim 1, wherein the input port of the 4-port coupler is connected to the output matching circuit, the output port of the 4-port coupler is connected to the antenna load, and predetermined impedance elements are respectively connected to the coupled and the isolation ports of the 4-port coupler.

3. The power amplifier according to claim 2, wherein the incident signals (a1, a2, a3, a4) and the reflection signals (b1, b2, b3, b4) have the following relationship with unique parameters S of the 4-port coupler:

$$\begin{bmatrix} b1 \\ b2 \\ b3 \\ b4 \end{bmatrix} = \begin{bmatrix} S11 & S12 & S13 & S14 \\ S21 & S22 & S23 & S24 \\ S31 & S32 & S33 & S34 \\ S41 & S42 & S43 & S44 \end{bmatrix} \begin{bmatrix} a1 \\ a2 \\ a3 \\ a4 \end{bmatrix},$$

wherein the impedance elements are determined such that the reflection coefficients $\Gamma_D$ and $\Gamma_{CT}$ of the coupled and isolation ports of the 4-port coupler satisfy the following formula:

$$D = -\frac{\alpha\gamma}{\beta}$$
$$\Gamma_D = \frac{1}{B + S33}$$
$$B = -\frac{\alpha\beta}{\gamma}$$
$$\Gamma_{CT} = \frac{1}{D + S44},$$

wherein $\alpha$, $\beta$ and $\gamma$ have the following relationships with parameters S when the impedance of each of the coupled and isolation ports of the 4-port coupler is matched to 50 ohms:

$S21=S12=S34=S43=\alpha$ $S31=S13=S24=S42=\beta$ $S32=S23=S14=S41=\gamma$.

4. The power amplifier according to claim 2, wherein the incident signals (a1, a2, a3, a4) and the reflection signals (b1, b2, b3, b4) have the following relationship with unique parameters S of the 4-port coupler:

$$\begin{bmatrix} b1 \\ b2 \\ b3 \\ b4 \end{bmatrix} = \begin{bmatrix} S11 & S12 & S13 & S14 \\ S21 & S22 & S23 & S24 \\ S31 & S32 & S33 & S34 \\ S41 & S42 & S43 & S44 \end{bmatrix} \begin{bmatrix} a1 \\ a2 \\ a3 \\ a4 \end{bmatrix},$$

wherein the impedance elements are determined such that the reflection coefficients $\Gamma_D$ and $\Gamma_{CT}$ of the coupled and isolation ports of the 4-port coupler satisfy the following formula:

$$D = \frac{\beta^2}{A}$$
$$\Gamma_D = \frac{1}{B + S33}$$
$$B = \frac{\alpha(\alpha^2 - \beta^2 - \gamma^2) - D \cdot \beta \cdot \gamma}{\alpha D + \beta\gamma}$$
$$\Gamma_{CT} = \frac{1}{D + S44},$$

wherein A has the following relationship with a reflection coefficient $\Gamma_L$ toward the antenna load from the output port of the 4-port coupler:

$$A = \frac{1 - S22 \cdot \Gamma_L}{\Gamma_L};$$

and
wherein $\alpha$, $\beta$ and $\gamma$ have the following relationships with parameters S when the impedance of each of the coupled and isolation ports of the 4-port coupler is matched to 50 ohms:

$S21=S12=S34=S43\le\alpha$ $S31=S13=S24=S42\le\beta$ $S32=S23=S14=S41\le\gamma$.

5. The power amplifier according to claim 2, further comprising: a phase adjusting unit for changing a phase of S21 of the 4-port coupler.

6. The power amplifier according to claim 5, wherein the phase adjusting unit is a phase shifter coupled between the output matching circuit and the input port of the 4-port coupler.

7. The power amplifier according to claim 6, wherein a phase value of the phase shifter is set such that an insertion loss of the 4-port coupler becomes a value close to 1.

8. The power amplifier according to claim 1, wherein the 4-port coupler is implemented using a metamaterial.

9. The power amplifier according to claim 4, wherein a phase of S21 of the 4-port coupler is set such that the insertion loss of the 4-port coupler becomes a value close to 1, using a metamaterial.

10. A power amplifier comprising:
a power amplification circuit which amplifies an input signal;
an output matching circuit connected to an output terminal of the power amplification circuit to perform impedance matching between the power amplification circuit and an antenna load;
a 4-port coupler provided between the output matching circuit and the antenna load; and
a phase shifter connected between the output matching circuit and an input port of the 4-port coupler.

11. The power amplifier according to claim 10, wherein the input port of the 4-port coupler is connected to the phase shifter, an output port of the 4-port coupler is connected to the antenna load, and predetermined impedance elements are respectively connected to coupled and isolation ports of the 4-port coupler.

12. The power amplifier according to claim 11, wherein the input port has a reflection coefficient $\Gamma_{PA}$ based on an incident signal a1 and a reflection signal b1, the output port has a reflection coefficient $\Gamma_L$ based on an incident signal a2 and a reflection signal b2, a coupled port of the 4-port coupler has a reflection coefficient $\Gamma_D$ based on an incident signal a3 and a reflection signal b3, and an isolation port of the 4-poprt coupler has a reflection coefficient $\Gamma_{CT}$ based on an incident signal a4 and a reflection signal b4, wherein the incident signals (a1, a2, a3, a4) and the reflection signals (b1, b2, b3, b4) have the following relationship with unique parameters S of the 4-port coupler:

$$\begin{bmatrix} b1 \\ b2 \\ b3 \\ b4 \end{bmatrix} = \begin{bmatrix} S11 & S12 & S13 & S14 \\ S21 & S22 & S23 & S24 \\ S31 & S32 & S33 & S34 \\ S41 & S42 & S43 & S44 \end{bmatrix} \begin{bmatrix} a1 \\ a2 \\ a3 \\ a4 \end{bmatrix},$$

wherein the impedance elements are determined such that the reflection coefficients $\Gamma_D$ and $\Gamma_{CT}$ of the coupled and isolation ports of the 4-port coupler satisfy the following formula:

$$D = \frac{\beta^2}{A}$$

$$\Gamma_D = \frac{1}{B + S33}$$

$$B = \frac{\alpha(\alpha^2 - \beta^2 - \gamma^2) - D \cdot \beta \cdot \gamma}{\alpha D + \beta \gamma}$$

$$\Gamma_{CT} = \frac{1}{D + S44},$$

wherein A has the following relationship with a reflection coefficient $\Gamma_L$ toward the antenna load from the output port of the 4-port coupler:

$$A = \frac{1 - S22 \cdot \Gamma_L}{\Gamma_L};$$

and wherein $\alpha$, $\beta$ and $\gamma$ have the following relationships with parameters S when the impedance of each of the coupled and isolation ports of the 4-port coupler is matched to 50 ohms, $S21 = S12 = S34 = S43 \leq \alpha$ $S31 = S13 = S24 = S42 \leq \beta$ $S32 = S23 = S14 = S41 \leq \gamma$.

* * * * *